United States Patent
Okada

(10) Patent No.: US 11,863,159 B2
(45) Date of Patent: Jan. 2, 2024

(54) ACOUSTIC WAVE FILTER

(71) Applicant: Murata Manufacturing Co., Ltd., Nagaokakyo (JP)

(72) Inventor: Shinichi Okada, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 431 days.

(21) Appl. No.: 17/156,756

(22) Filed: Jan. 25, 2021

(65) Prior Publication Data
US 2021/0242857 A1    Aug. 5, 2021

(30) Foreign Application Priority Data

Jan. 31, 2020 (JP) ................. 2020-014780

(51) Int. Cl.
| | |
|---|---|
| H03H 9/145 | (2006.01) |
| H03H 9/02 | (2006.01) |
| H03H 9/64 | (2006.01) |
| H03H 9/25 | (2006.01) |

(52) U.S. Cl.
CPC ...... H03H 9/1457 (2013.01); H03H 9/02559 (2013.01); H03H 9/02637 (2013.01); H03H 9/02834 (2013.01); H03H 9/02866 (2013.01); H03H 9/02937 (2013.01); H03H 9/02992 (2013.01); H03H 9/25 (2013.01); H03H 9/6483 (2013.01)

(58) Field of Classification Search
CPC .......... H03H 9/1457; H03H 9/02559; H03H 9/02637; H03H 9/02834; H03H 9/02866; H03H 9/02937; H03H 9/02992; H03H 9/25; H03H 9/6483; H03H 9/02574; H03H 9/14594; H03H 9/54; H03H 9/14541; H03H 9/171; H03H 9/725

USPC .......................... 333/133, 193–196
See application file for complete search history.

(56) References Cited

U.S. PATENT DOCUMENTS

| | | | |
|---|---|---|---|
| 2014/0015624 A1* | 1/2014 | Kishino | H03H 9/14547 333/187 |
| 2019/0123721 A1 | 4/2019 | Takamine | |
| 2019/0131954 A1 | 5/2019 | Okada | |

FOREIGN PATENT DOCUMENTS

| | | |
|---|---|---|
| JP | 2000-114923 A | 4/2000 |
| WO | 2018003273 A1 | 1/2018 |
| WO | 2018003338 A1 | 1/2018 |

OTHER PUBLICATIONS

Office Action in JP2020014780, dated Aug. 2, 2022, 4 pages.

* cited by examiner

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave filter includes first and second series-arm resonators, each including an IDT electrode including electrode fingers and a busbar electrode connecting first ends of the electrode fingers to each other. A direction in which second ends of the electrode fingers are aligned with each other crosses a propagation direction of an acoustic wave. The electrode fingers of the IDT electrodes of the first and second series-arm resonators each include an electrode-finger central portion and a wide portion located at the second end and being wider than the electrode-finger central portion. The length of the wide portion of each of the electrode fingers in the first series-arm resonator is greater than the length of the wide portion of each of the electrode fingers in the second series-arm resonator.

20 Claims, 12 Drawing Sheets

ACOUSTIC WAVE FILTER

CROSS REFERENCE TO RELATED APPLICATIONS

This application claims the benefit of priority to Japanese Patent Application No. 2020-014780 filed on Jan. 31, 2020. The entire contents of this application are hereby incorporated herein by reference.

BACKGROUND OF THE INVENTION

1. Field of the Invention

The present invention relates to an acoustic wave filter.

2. Description of the Related Art

A ladder acoustic wave filter including series-arm resonators and parallel-arm resonators is known. Japanese Unexamined Patent Application Publication No. 2000-114923 discloses an acoustic wave filter including series-arm resonators and parallel-arm resonators each of which includes an interdigital transducer (IDT) electrode and reflector electrodes.

According to Japanese Unexamined Patent Application Publication No. 2000-114923, each reflector electrode includes two busbars. One of the busbars is adjacent to a signal wiring electrode, and the other busbar is connected to one comb teeth-shaped electrode closer than another comb teeth-shaped electrode of the IDT electrode to the ground such that the resonator is provided with the resultant capacitance generated between the signal wiring electrode and the ground. Japanese Unexamined Patent Application Publication No. 2000-114923 also describes that providing a series-arm resonator with capacitance causes a shift of the anti-resonant frequency of the series-arm resonator toward a lower frequency side.

As described in Japanese Unexamined Patent Application Publication No. 2000-114923, the shift of the anti-resonant frequency of the series-arm resonator toward a lower frequency side enables the attenuation slope in a frequency range higher than the pass band of the acoustic wave filter to become steeper.

When the capacitance is provided parallel to a series-arm resonator, the Q-factor at the anti-resonant frequency is deteriorated due to the resistive component of the capacitance, and the return loss (insertion loss) in the pass band increases accordingly.

SUMMARY OF THE INVENTION

Preferred embodiments of the present invention provide acoustic wave filters that each reduce return loss in a pass band while enabling an attenuation slope in a frequency range higher than the pass band to become steeper.

According to a preferred embodiment of the present invention, an acoustic wave filter includes a first series-arm resonator and a second series-arm resonator that are disposed on a path connecting a first terminal and a second terminal. The first series-arm resonator has a lower anti-resonant frequency than any other series-arm resonator included in the acoustic wave filter. The first series-arm resonator and the second series-arm resonator each include an IDT electrode including a pair of comb teeth-shaped electrodes provided on a substrate including a piezoelectric layer. Electrodes of the pair of comb teeth-shaped electrodes of the first series-arm resonator and electrodes of the pair of comb teeth-shaped electrodes of the second series-arm resonator each include electrode fingers and a busbar electrode. The electrode fingers extend in a direction orthogonal or substantially orthogonal to a propagation direction of an acoustic wave. The busbar electrode connects first ends of the electrode fingers to each other. A direction in which second ends of the electrode fingers are aligned with each other crosses the propagation direction of the acoustic wave. The electrode fingers of the IDT electrode of the first series-arm resonator and the electrode fingers of the IDT electrode of the second series-arm resonator each include an electrode-finger central portion and a wide portion. The wide portion is located at the second end and is wider than the electrode-finger central portion. The length of the wide portion of each of the electrode fingers in the first series-arm resonator in the direction in which the electrode fingers extend is greater than the length of the wide portion of each of the electrode fingers in the second series-arm resonator in the direction in which the electrode fingers extend.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
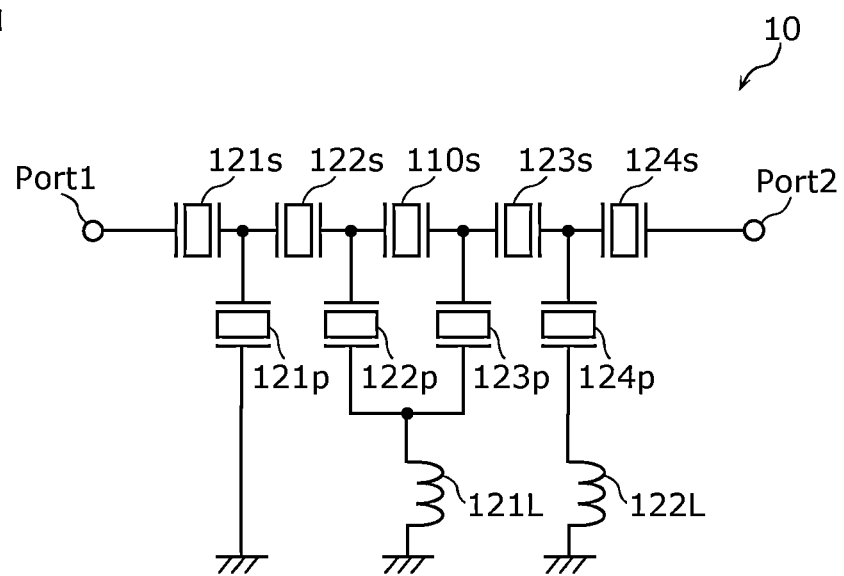
FIG. 1 is a circuit configuration diagram of an acoustic wave filter according to Preferred Embodiment 1 of the present invention.

Hereinafter, the present invention will be described in detail with reference to preferred embodiments and the accompanying drawings. The following preferred embodiments are general or specific examples. Details, such as values, shapes, materials, components, and arrangements and connection configurations of the components in the following preferred embodiments, are provided merely as examples and should not be construed as limiting the present invention. Of the components in the following preferred embodiments, those not mentioned in an independent claim are described as optional components. The sizes and the relative proportions of the components illustrated in the drawings are not necessarily to scale. Redundant description of the same or corresponding components, which are denoted by the same reference signs in the drawings, will be omitted or described in brief. The expression "connected to" in the description of the following preferred embodiments includes not only direct connection but also electrical connection through another element or the like.

Preferred Embodiment 1

1-1 Basic Configuration of Acoustic Wave Filter

The following describes a basic configuration of an acoustic wave filter according to Preferred Embodiment 1 of the present invention with reference to FIG. 1.

FIG. 1 is a circuit configuration diagram of an acoustic wave filter 10 according to Preferred Embodiment 1.

The acoustic wave filter 10 includes a series-arm resonator 110s, series-arm resonators 121s to 124s, parallel-arm resonators 121p to 124p, and inductors 121L and 122L. The series-arm resonators 110s and 121s to 124s are disposed on a path connecting a first terminal Port1 and the second terminal Port2. The parallel-arm resonators 121p to 124p are disposed between the path and a reference terminal (i.e., ground).

The series-arm resonator 110s is hereinafter also referred to as a first series-arm resonator 110s. The series-arm resonators different from the first series-arm resonator 110s are hereinafter referred to as second series-arm resonators 121s, 122s, 123s, and 124s.

The first series-arm resonator 110s and the second series-arm resonators 121s to 124s are connected in series on the path (series arm) connecting the first terminal Port1 and the second terminal Port2. The second series-arm resonator 121s, the second series-arm resonator 122s, the first series-arm resonator 110s, the second series-arm resonator 123s, and the second series-arm resonator 124s are connected in series in the stated order in the direction from the first terminal Port1 to the second terminal Port2.

The parallel-arm resonators 121p to 124p are connected in parallel and disposed on respective paths (parallel arms) each of which connects the reference terminal and the corresponding one of points at which the first series-arm resonator 110s and the second series-arm resonators 121s to 124s are connected to each other. Specifically, one end of the parallel-arm resonator 121p is connected to a node between the series-arm resonators 121s and 122s, and the other end of the parallel-arm resonator 121p is connected directly to the reference terminal. One end of the parallel-arm resonator 122p is connected to a node between the series-arm resonators 122s and 110s, and the other end of the parallel-arm resonator 122p is connected to the reference terminal with the inductor 121L therebetween. One end of the parallel-arm resonator 123p is connected to a node between the series-arm resonators 110s and 123s, and the other end of the parallel-arm resonator 123p is connected to the reference terminal with the inductor 121L therebetween. One end of the parallel-arm resonator 124p is connected to a node between the series-arm resonators 123s and 124s, and the other end of the parallel-arm resonator 124p is connected to the reference terminal with the inductor 122L therebetween.

The first series-arm resonator 110s, the second series-arm resonators 121s to 124s, and the parallel-arm resonators 121p to 124p are connected as described above to define the acoustic wave filter 10 that is, for example, a ladder bandpass filter.

The resonant frequency of the first series-arm resonator 110s and the resonant frequencies of the second series-arm resonators 121s to 124s are within the pass band of the acoustic wave filter 10. The second series-arm resonators 121s to 124s may include respective number of electrode finger pairs, respective intersecting widths, and respective resonant frequencies. The anti-resonant frequency of the first series-arm resonator 110s is lower than any of the anti-resonant frequencies of the second series-arm resonators 121s to 124s. That is, the first series-arm resonator 110s has a lower anti-resonant frequency than any other series-arm resonator (i.e., the series-arm resonators 121s to 124s) included in the acoustic wave filter 10.

The position of the first series-arm resonator 110s is not limited to the point between the second series-arm resonators 122s and 123s. The first series-arm resonator 110s may be disposed between the second series-arm resonators 121s and 122s or may be disposed between the second series-arm resonators 123s and 124s, for example. Alternatively, the first series-arm resonator 110s may be disposed between the first terminal Port1 and the second series-arm resonator 121s or may be disposed between the second series-arm resonator 124s and the second terminal Port2, for example.

Instead of including one first series-arm resonator (i.e., the first series-arm resonator 110s), the acoustic wave filter 10 may include two or more first series-arm resonators. The acoustic wave filter 10 does not necessarily include four second series-arm resonators (i.e., the second series-arm resonators 121s to 124s) and four parallel-arm resonators (i.e., the parallel-arm resonators 121p to 124p. The acoustic wave filter 10 includes at least one second series-arm resonator and at least one parallel-arm resonator.

1-2 Basic Structures of Resonators

The following describes basic structures of the resonators (i.e., the series-arm resonators and the parallel-arm resonators) of the acoustic wave filter 10. The resonators are preferably surface acoustic wave (SAW) resonators, for example.

Figure 2:
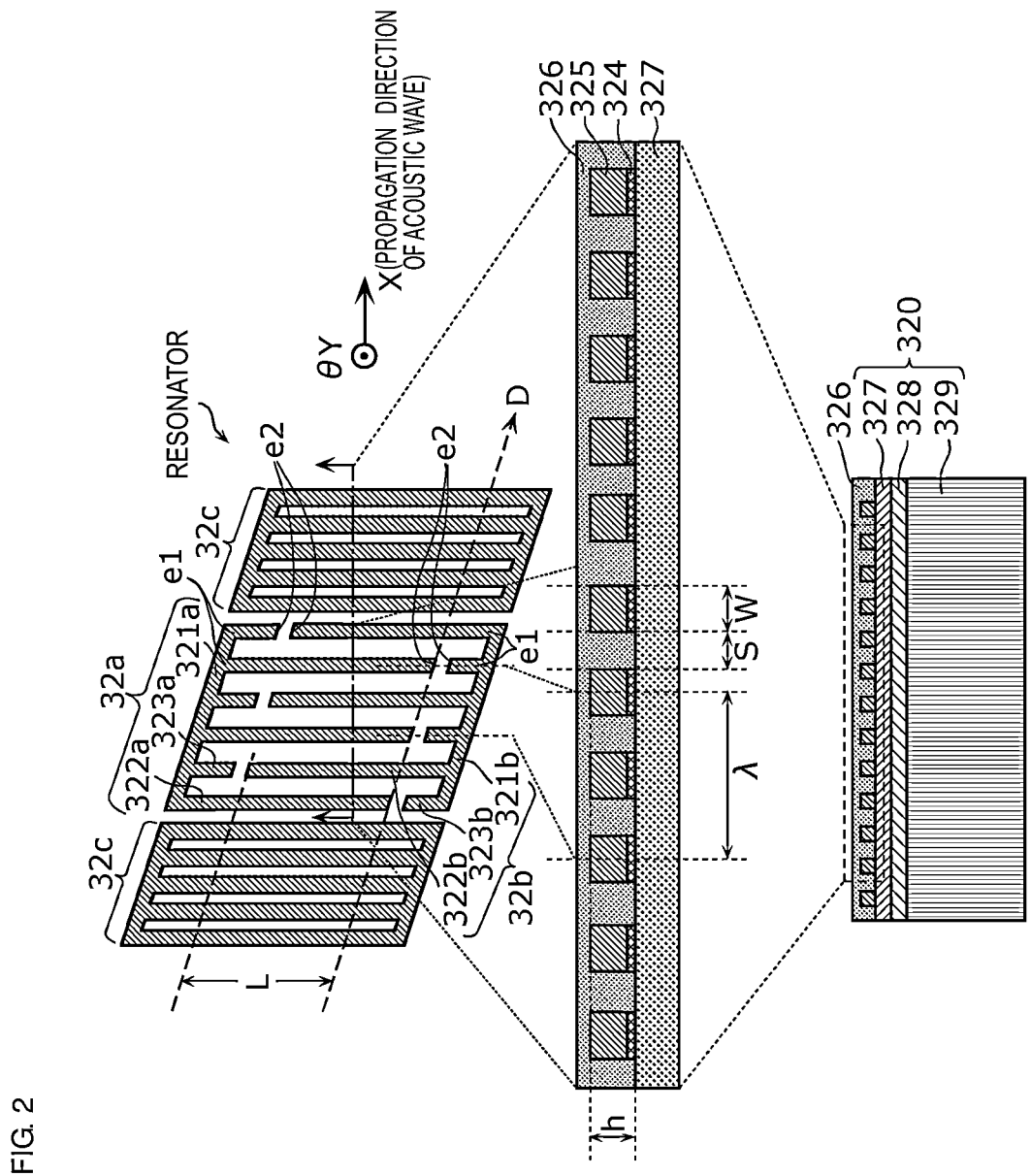
FIG. 2 includes a schematic plan view and a schematic sectional view of a resonator of the acoustic wave filter according to Preferred Embodiment 1 of the present invention.

FIG. 2 includes a schematic plan view and a schematic sectional view of a resonator of the acoustic wave filter 10. The resonator illustrated in FIG. 2 represents a typical structure of the resonators described above. Details such as the number and the length of electrode fingers of each electrode may be changed.

When viewed in plan as in FIG. 2, the resonator includes a pair of comb teeth-shaped electrodes and a pair of resonators. Electrodes of the pair of comb teeth-shaped electrodes face each other and are denoted by 32a and 32b, respectively. Reflectors of the pair of reflectors are denoted by 32c and are adjacent to the comb teeth-shaped electrodes 32a and 32b in a propagation direction of an acoustic wave. The pair of comb teeth-shaped electrodes, or more specifically, the comb teeth-shaped electrodes 32a and 32b define an interdigital transducer (IDT) electrode. Either of the two reflectors 32c may be omitted when constraints arise from, for example, the mounting layout.

The comb teeth-shaped electrode 32a includes electrode fingers 322a, offset electrode fingers 323a, and a busbar electrode 321a. The electrode fingers 322a and the offset electrode fingers 323a are disposed in parallel. The busbar electrode 321a connects first ends e1 of the electrode finger 322a to each other and also connects first ends e1 of the offset electrode fingers 323a to each other. The comb teeth-shaped electrode 32b includes electrode fingers 322b, offset electrode fingers 323b, and a busbar electrode 321b. The electrode fingers 322b and the offset electrode fingers 323b are parallel or substantially parallel to each other. The busbar electrode 321b connects first ends e1 of the electrode fingers 322b to each other and also connects first ends e1 of the offset electrode fingers 323b to each other.

The electrode fingers 322a, the electrode fingers 322b, the offset electrode fingers 323a, and the offset electrode fingers 323b extend in a direction orthogonal or substantially orthogonal to the propagation direction of the acoustic wave (i.e., in a direction orthogonal or substantially orthogonal to the X-axis). Each of the electrode fingers 322a faces the corresponding one of the offset electrode fingers 323b in the direction orthogonal or substantially orthogonal to the propagation direction of the acoustic wave, and each of the electrode fingers 322b faces the corresponding one of the offset electrode fingers 323a in the direction orthogonal or substantially orthogonal to the propagation direction of the acoustic wave.

The direction in which second ends e2 of the electrode fingers 322a (i.e., end portions that are not connected to the busbar electrode 321a) are aligned with each other is denoted by D and crosses the propagation direction of the acoustic wave at a predetermined angle. The direction in which second ends e2 of the electrode fingers 322b (i.e., end portions that are not connected to the busbar electrode 321b) are aligned with each other is denoted by D and crosses the propagation direction of the acoustic wave at the predetermined angle. The direction in which second ends e2 of the offset electrode fingers 323a (i.e., end portions that are not connected to the busbar electrode 321a) are aligned with each other is denoted by D and crosses the propagation direction of the acoustic wave at the predetermined angle. The direction in which second ends e2 of the offset electrode fingers 323b (i.e., end portions that are not connected to the busbar electrode 321b) are aligned with each other is denoted by D and crosses the propagation direction of the acoustic wave at the predetermined angle.

That is, the first series-arm resonator 110s, the second series-arm resonators 121s to 124s, and the parallel-arm resonators 121p to 124p each includes an inclined IDT electrode whose electrode fingers extend in a direction crossing the propagation direction of the acoustic wave.

Meanwhile, when a one-port SAW resonator including a piezoelectric layer is included in an acoustic wave filter, a transverse mode ripple may appear between the resonant frequency and the anti-resonant frequency of the resonator and can cause degradation of transmission characteristics in the pass band of the filter. To address this problem, the acoustic wave filter 10 according to the present preferred embodiment includes resonators whose IDT electrodes are inclined IDTs.

Another feature of the acoustic wave filter 10 according to the present preferred embodiment is that the second ends e2 of the electrode fingers 322a, the second ends e2 of the electrode fingers 322b, the second ends e2 of the offset electrode fingers 323a, and the second ends e2 of the offset electrode fingers 323b each have an atypical shape, or more specifically, the second ends e2 are preferably T-shaped (see FIGS. 3A and 3B), for example. The atypical shape will be described in detail later.

The pair of reflectors (i.e., the reflectors 32c) are adjacent to the pair of comb teeth-shaped electrodes (i.e., the comb teeth-shaped electrodes 32a and 32b) in the direction D. Specifically, the reflectors 32c are disposed with the comb teeth-shaped electrodes 32a and 32b therebetween in the direction D. The reflectors 32c each include reflector electrode fingers parallel or substantially parallel to each other and reflector busbar electrodes connecting the reflector electrode fingers to each other. The reflector busbar electrodes of each reflector 32c extend in the direction D.

When viewed in a cross-section as in FIG. 2, the IDT electrode including the electrode fingers 322a, the electrode fingers 322b, the offset electrode fingers 323a, the offset electrode fingers 323b, and the busbar electrodes 321a and 321b has a multilayer structure including an adhesive layer 324 and a main electrode layer 325. The structure of each reflector 32c viewed in a cross-section is the same as or similar to the structure of the IDT electrode viewed in cross-section and will not be further described here.

The adhesive layer 324 improves the adhesion between a piezoelectric layer 327 and the main electrode layer 325 and is preferably made of, for example, Ti.

The main electrode layer 325 is preferably made mainly of Al and has a Cu content of about 1%, for example.

The IDT electrode is covered with a protective layer 326. The protective layer 326 is provided, for example, to protect the main electrode layer 325 from the external environment, to adjust the frequency-temperature characteristics, and to improve the moisture resistance. The protective layer 326 is preferably made mainly of, for example, silicon dioxide.

The materials of the adhesive layer 324, the main electrode layer 325, and the protective layer 326 are not limited to the materials described above. It is not required that the IDT electrode have the multilayer structure. The IDT electrode may be made of a metal such as Ti, Al, Cu, Pt, Au, Ag, or Pd or may be made of an alloy, for example. The IDT electrode may include multilayer bodies made of these metals or alloys. The protective layer 326 is optional.

The IDT electrode and the reflectors 32c are disposed on a main surface of a substrate 320, which will be described below. The following describes a multilayer structure of the substrate 320.

As illustrated in the lower section of FIG. 2, the substrate 320 includes a high-acoustic-velocity support substrate 329, a low-acoustic-velocity film 328, and the piezoelectric layer 327. The high-acoustic-velocity support substrate 329, the low-acoustic-velocity film 328, and the piezoelectric layer 327 are stacked on top of each other in the stated order.

The piezoelectric layer 327 is, for example, a piezoelectric film. The IDT electrode and the reflectors 32c are disposed on a main surface of the piezoelectric layer 327. The piezoelectric layer 327 is preferably made of, for example, a θ°-rotated Y cut X SAW propagation $LiTaO_3$ piezoelectric single crystal or θ°-rotated Y cut X SAW propagation $LiTaO_3$ piezoelectric ceramics obtained by cutting a lithium tantalate single crystal or ceramics along a plane whose normal line is an axis rotated from a Y-axis by θ° with an X-axis as the central axis. The surface acoustic wave propagates in the X-axis direction through a single crystal or ceramics. The piezoelectric layer 327 preferably has a thickness of, for example, about 3.5λ or less, where λ denotes the wavelength of the acoustic wave and is determined by the electrode-to-electrode pitch of the IDT electrode. For example, the piezoelectric layer 327 preferably has a thickness of about 600 nm.

The high-acoustic-velocity support substrate 329 supports the low-acoustic-velocity film 328, the piezoelectric layer 327, and the IDT electrode. The acoustic velocity of a bulk wave propagating through the high-acoustic-velocity support substrate 329 is higher than the acoustic velocity of an acoustic wave such as a surface acoustic wave or a boundary wave propagating though the piezoelectric layer 327. The high-acoustic-velocity support substrate 329 confines the surface acoustic wave in the portion where the piezoelectric layer 327 is stacked on the low-acoustic-velocity film 328, and the surface acoustic wave is thus reduced or prevented from leaking to underneath the high-acoustic-velocity support substrate 329. The high-acoustic-velocity support substrate 329 is preferably, for example, a silicon substrate having a thickness of about 125 μm. Examples of the material of the high-acoustic-velocity support substrate 329 include: (1) piezoelectric materials such as aluminum nitride, aluminum oxide, silicon carbide, silicon nitride, silicon, sapphire, lithium tantalate, lithium niobate, and quartz; (2) various ceramics such as alumina, zirconia, cordierite, mullite, steatite, and forsterite; (3) magnesia diamond; (4) materials containing any of the above materials as a principal component; and (5) materials containing a mixture of the above materials as a principal component.

The acoustic velocity of a bulk wave propagating through the low-acoustic-velocity film 328 is lower than the velocity of an acoustic wave propagating through the piezoelectric layer 327. The low-acoustic-velocity film 328 is disposed between the piezoelectric layer 327 and the high-acoustic-velocity support substrate 329. Energy of an acoustic wave inherently concentrates in a low-acoustic-velocity medium. Together with this property, the above structure helps eliminate or reduce the possibility that energy of the surface acoustic wave will leak out of the IDT electrode. The low-acoustic-velocity film 328 preferably includes, for example, silicon dioxide as a principal component. The low-acoustic-velocity film 328 preferably has a thickness of, for example, about 2λ or less, where λ denotes the wavelength of the acoustic wave and is determined by the electrode-to-electrode pitch of the IDT electrode. For example, the low-acoustic-velocity film 328 preferably has a thickness of about 670 nm.

The Q-factor at the resonant frequency and the Q-factor at the anti-resonant frequency of the resonator on the substrate 320, that is, on the multilayer structure described above may be much higher than the corresponding Q-factors of a resonator on a known structure including a single piezoelectric substrate. That is, the multilayer structure may be used to obtain a SAW resonator with a high Q-factor, and the SAW resonator may be used to obtain an acoustic wave filter having a small insertion loss.

The high-acoustic-velocity support substrate 329 may be a multilayer structure including a support substrate and a high-acoustic-velocity film stacked on the support substrate, where the acoustic velocity of a bulk wave propagating through the high-acoustic-velocity film is higher than the acoustic velocity of an acoustic wave such as a surface acoustic wave or a boundary wave propagating through the piezoelectric layer 327. In this case, examples of the material of the support substrate include: piezoelectric materials such as sapphire, lithium tantalate, lithium niobate, and quartz; various ceramics such as alumina, magnesia, silicon nitride, aluminum nitride, silicon carbide, zirconia, cordierite, mullite, steatite, and forsterite; a dielectric material such as glass; a semiconductor such as silicon and gallium nitride; and resin. Examples of the material of the high-acoustic-velocity film include: aluminum nitride, aluminum oxide, silicon carbide, silicon nitride, silicon oxynitride, a diamond-like carbon (DLC) film, and diamond; mediums containing the above materials as a principal component; mediums containing a mixture of the above materials as a principal component; and other various high-acoustic-velocity materials.

Although the θ°-rotated Y cut X SAW propagation $LiTaO_3$ single crystal is used as the piezoelectric layer 327 in the present preferred embodiment, the cut-angle of the single crystal material is not limited to the specified angle. The multilayer structure, the material, and the thickness of the substrate may be changed as appropriate in accordance with, for example, the bandpass characteristics required of the acoustic wave filter device concerned. A SAW filter including a $LiTaO_3$ piezoelectric substrate or a $LiNbO_3$ piezoelectric substrate having a cut-angle different from the specified angle may produce the same or substantially the same advantageous effects described above.

The following describes electrode parameters of the IDT electrode included in the SAW resonator.

The wavelength of the SAW resonator is determined by the wavelength λ, which the repetition period of the electrode fingers 322a or the electrode fingers 322b included in the IDT electrode (see the middle section of FIG. 2). The electrode-to-electrode pitch is half the wavelength λ and is expressed as (W+S), where W denotes the line width of each of the electrode fingers 322a included in the comb teeth-shaped electrode 32a or each of the electrode fingers 322b included in the comb teeth-shaped electrode 32b, and S denotes the space width, or more specifically, the distance between the electrode finger 322a and the electrode finger 322b adjacent to each other. The intersecting width of the pair of comb teeth-shaped electrodes (i.e., the comb teeth-shaped electrodes 32a and 32b) is denoted by L and is the length of an overlap between each electrode finger 322a and each electrode finger 322b viewed in the direction D (see the upper section of FIG. 2). The electrode duty ratio of each resonator refers to the proportion of the line width of the electrode fingers 322a and 322b, or more specifically, the ratio of the line width to the value obtained by adding the line width to the space width of the electrode fingers 322a and 322b and is expressed as W/(W+S). Each electrode parameter will be specifically described later.

1-3 IDT Electrodes of Series-Arm Resonators

Figure 3A:
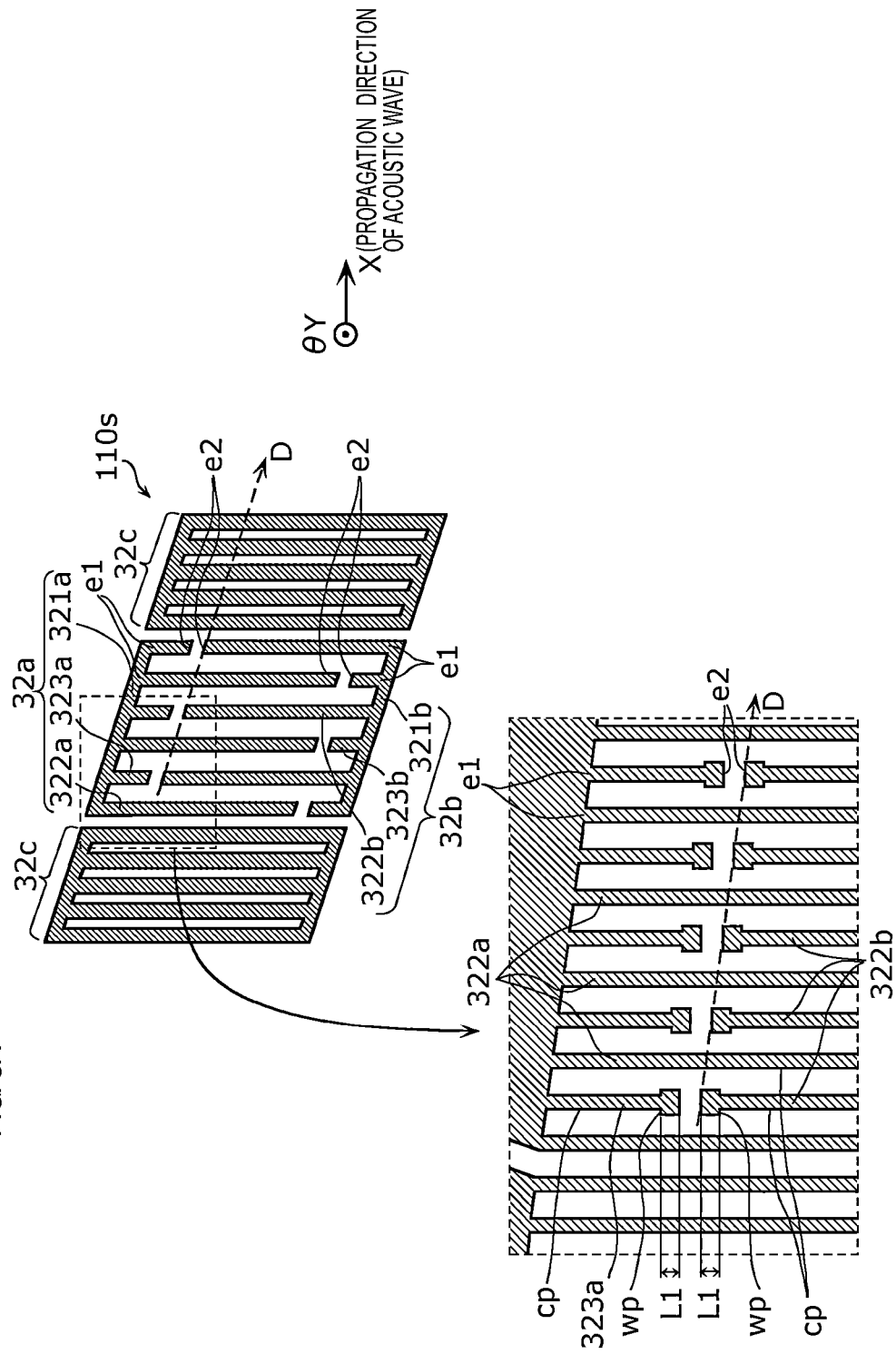
FIG. 3A illustrates an IDT electrode of a first series-arm resonator included in the acoustic wave filter according to Preferred Embodiment 1 of the present invention.
Figure 3B:
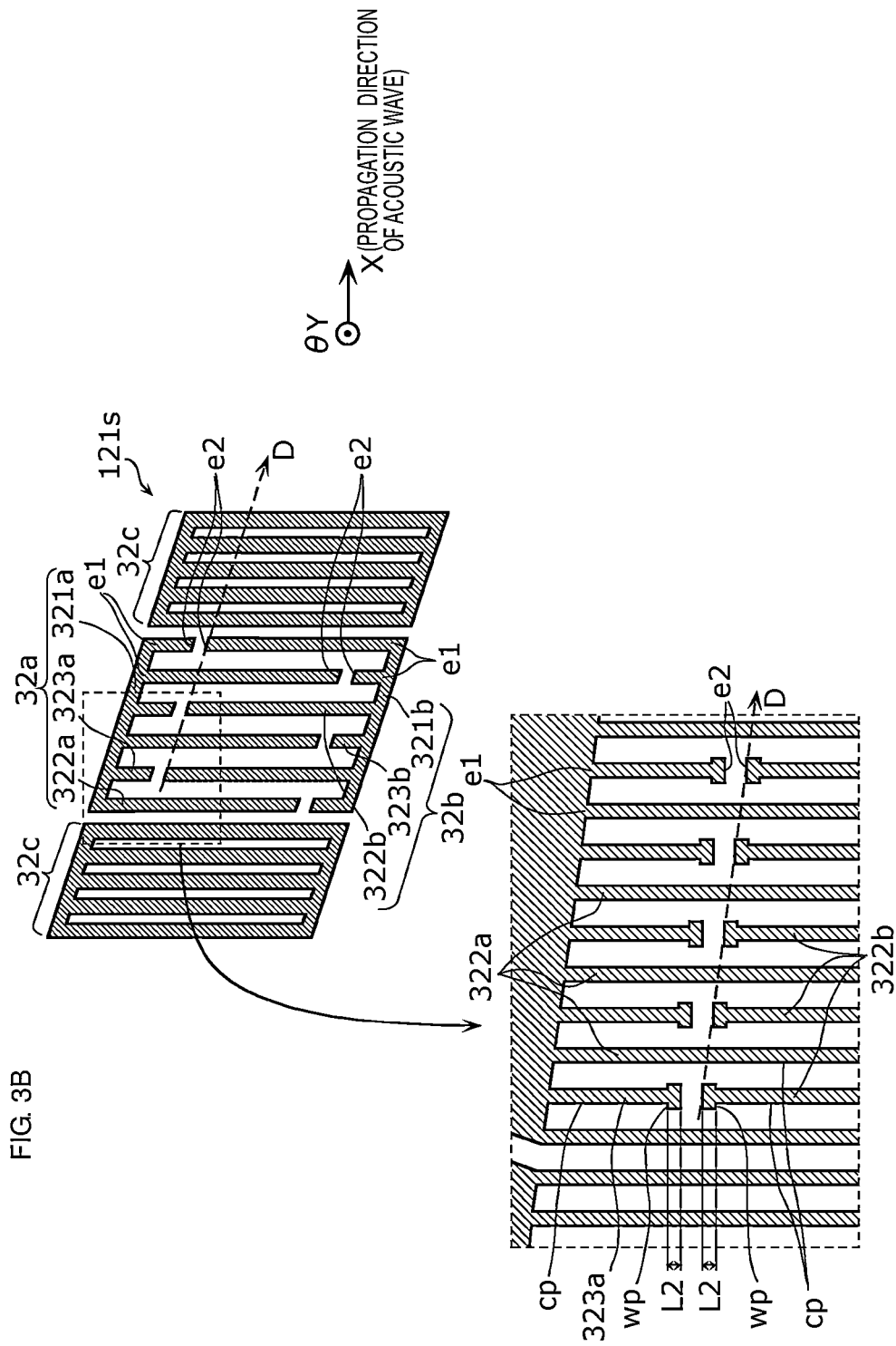
FIG. 3B illustrates an IDT electrode of a second series-arm resonator included in the acoustic wave filter according to Preferred Embodiment 1 of the present invention.

The following describes the structure of the IDT electrode of the first series-arm resonator 110s and the IDT electrode of each of the second series-arm resonators 121s to 124s with reference to FIGS. 3A and 3B, respectively.

FIG. 3A illustrates the IDT electrode of the first series-arm resonator 110s included in the acoustic wave filter 10. FIG. 3B illustrates the IDT electrode of the second series-arm resonator 121s included in the acoustic wave filter 10. The second series-arm resonator 121s in FIG. 3B will be described below as an example of the second series-arm resonators 121s to 124s.

Referring to FIG. 3A, the electrode fingers 322b and the offset electrode fingers 323a in the first series-arm resonator 110s each have an atypical shape, or more specifically, are preferably T-shaped, for example. Referring to FIG. 3B, the electrode fingers 322b and the offset electrode fingers 323a in the second series-arm resonator 121s each have an atypical shape, or more specifically, are preferably T-shaped, for example.

The structure of the second ends e2 of the electrode fingers 322a and the second ends e2 of the offset electrode fingers 323b (not illustrated in the enlarged views in FIGS. 3A and 3B) is the same or substantially the same as the structure of the second ends e2 of the electrode fingers 322b and the second ends e2 of the offset electrode fingers 323a. That is, the electrode fingers 322a and the offset electrode fingers 323b in the first series-arm resonator 110s and the electrode fingers 322a and the offset electrode fingers 323b in the second series-arm resonator 121s each have an atypical shape, or more specifically, are preferably T-shaped, for example.

Each electrode finger has an atypical shape. That is, the second end e2 that is not connected to the busbar electrode is wider than the central portion of the electrode finger. Specifically, the electrode fingers 322a and 322b each include an electrode-finger central portion cp and a wide portion wp located at the second end e2 and being wider than the electrode-finger central portion cp. The wide portion wp is preferably rectangular or substantially rectangular, for example. Alternatively, the wide portion wp may be substantially octagonal, cross-shaped, or convex, for example. The electrode-finger central portion cp refers to a portion of each electrode finger except for end portions opposite each other in the direction in which the electrode finger extends.

Each electrode finger 322a includes the wide portion wp such that the gap in the X direction between the wide portion wp of the electrode finger 322a and the electrode finger 322b adjacent to the wide portion wp is smaller than the gap between the electrode-finger central portions cp of the electrode fingers 322a and 322b adjacent to each other. Each electrode finger 322b includes the wide portion wp such that the gap between the wide portion wp of the electrode finger 322b and the electrode finger 322a adjacent to the wide portion wp is smaller than the gap between the electrode-finger central portions cp of the electrode fingers 322b and 322a adjacent to each other.

For example, when the electrode duty ratio is about 0.5, the gap between the electrode fingers 322a and 322b adjacent to each other is preferably about 0.25λ, and the gap between the wide portion wp of the electrode finger 322a and the electrode finger 322b adjacent to the wide portion wp is preferably not less than about 0.1λ and not more than about 0.2λ.

In the present preferred embodiment, L1 is greater than L2 (L2<L1), where L1 denotes the length of the wide portion wp of each of the electrode fingers 322a and 322b in the first series-arm resonator 110s in the direction in which the electrode fingers extend, and L2 denotes the length of the wide portion wp of each of the electrode fingers 322a and 322b in the second series-arm resonators 121s to 124s in the direction in which the electrode fingers extend. The same holds true for the offset electrode fingers. That is, L1 is greater than L2, where L1 denotes the length of the wide portion wp of each of the offset electrode fingers 323a and 323b in the first series-arm resonator 110s in the direction in which the offset electrode fingers extend, and L2 denotes the length of the wide portion wp of each of the offset electrode fingers 323a and 323b in the second series-arm resonators 121s to 124s in the direction in which the offset electrode fingers extend. That is, the wide portion wp of each electrode finger in the first series-arm resonator 110s is longer than the wide portion wp of each electrode in any of the other series-arm resonators (i.e., the series-arm resonators 121s to 124s).

The length L1 of the wide portion wp of each electrode finger in the first series-arm resonator 110s is preferably, for example, not less than about 0.1λ and not more than about 0.4λ, where λ denotes the wavelength of the acoustic wave filter 10. The intersecting width L of the electrode fingers 322a and 322b is preferably not greater than about 20λ, for example.

In the present preferred embodiment, the offset electrode fingers 323a and 323b each include an electrode-finger central portion cp and a wide portion wp located at the second end e2 and being wider than the electrode-finger central portion cp. The length L1 of the wide portion wp of each of the offset electrode fingers 323a and 323b is equal to the length L1 of the wide portion wp of each of the electrode fingers 322a and 322b.

1-4 Example 1 According to Preferred Embodiment 1

The following describes characteristics of the first series-arm resonator 110s according to Example 1 of Preferred Embodiment 1 with reference to Table 1 and FIGS. 4 to 6B.

Figure 5:
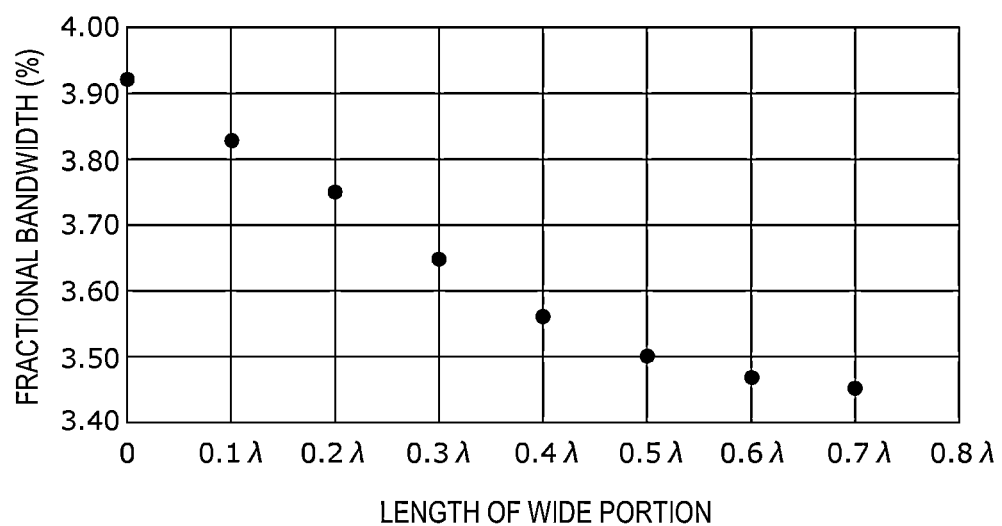
FIG. 5 is a graphical representation of the fractional bandwidth of the first series-arm resonator according to Example 1 of Preferred Embodiment 1 of the present invention.
Figure 6A:
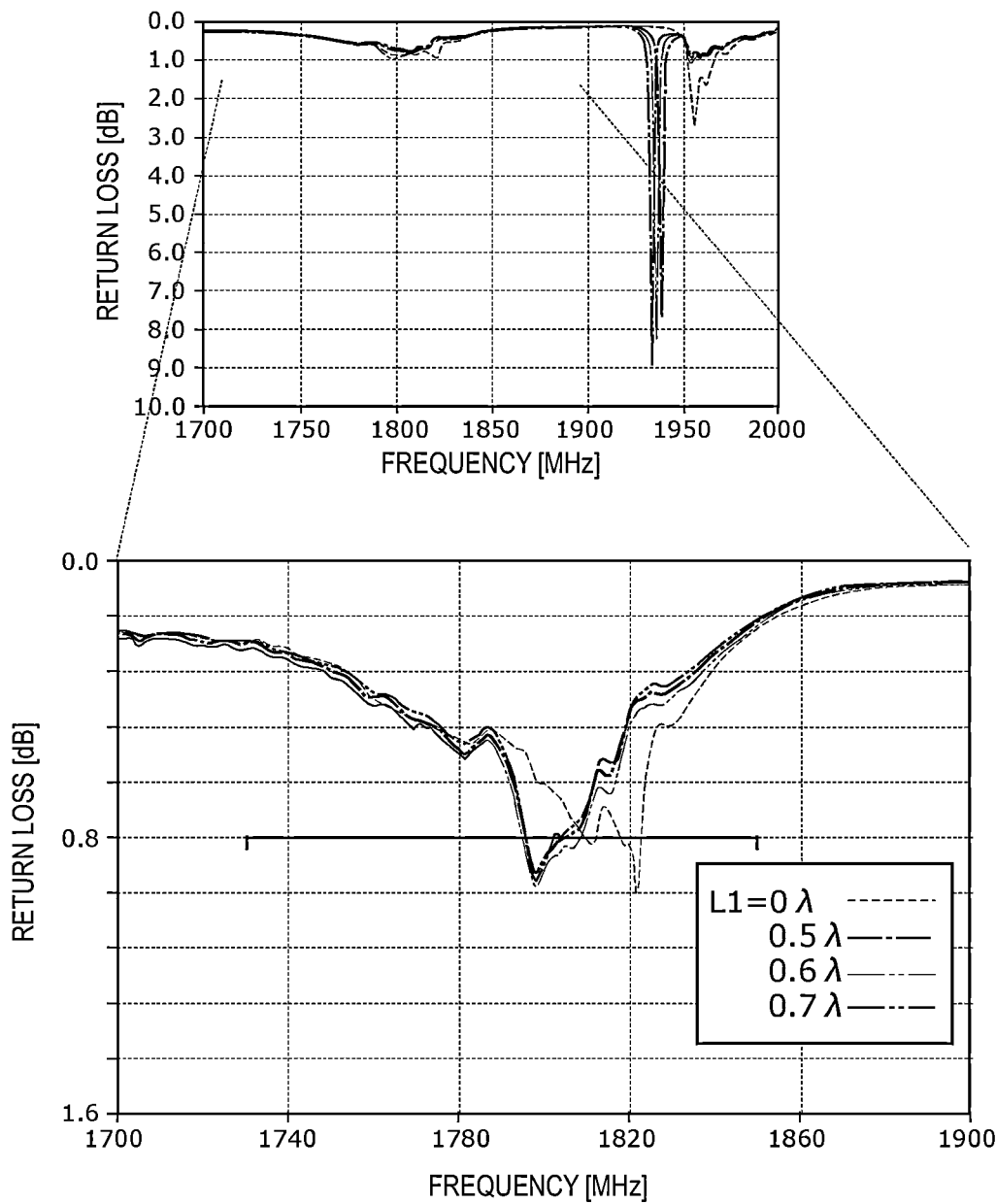
FIG. 6A is a graphical representation of the return loss of the first series-arm resonator according to Example 1 of Preferred Embodiment 1 of the present invention, where each electrode finger in the first series-arm resonator has a wide portion having a length of $0\lambda$, about $0.5\lambda$, about $0.6\lambda$, or about $0.7\lambda$.
Figure 6B:
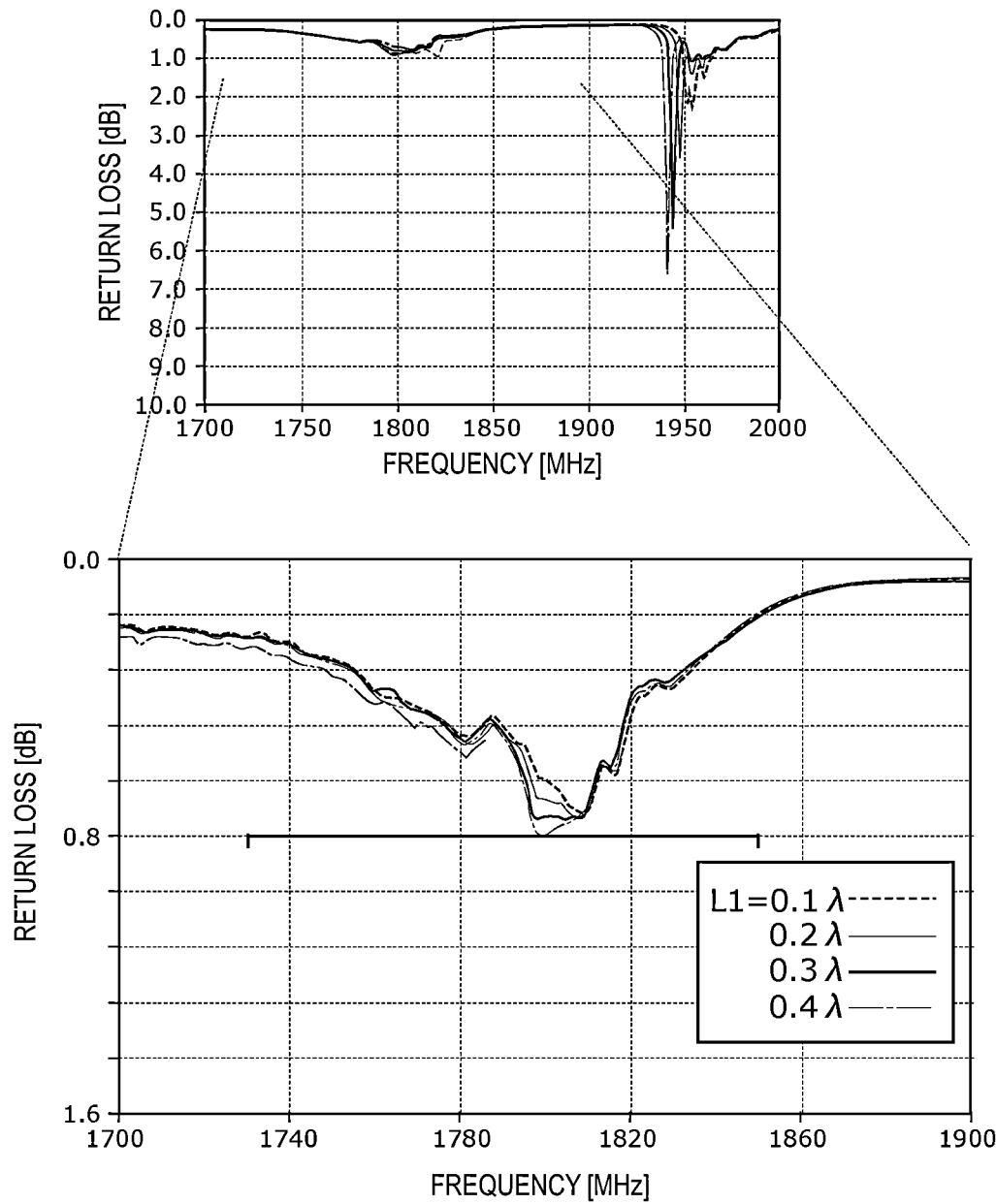
FIG. 6B is a graphical representation of the return loss of the first series-arm resonator according to Example 1 of Preferred Embodiment 1 of the present invention, where each electrode finger in the first series-arm resonator has a wide portion having a length of about $0.1\lambda$, about $0.2\lambda$, about $0.3\lambda$, or about $0.4\lambda$.

Table 1 shows the fractional bandwidth (%) and the return loss (dB) of the first series-arm resonator 110s with variations in the length L1 of the wide portion wp of each of the electrode fingers (i.e., the electrode fingers 322a, the electrode fingers 322b, the offset electrode fingers 323a, and the offset electrode fingers 323b) in the first series-arm resonator 110s. The values of the fractional bandwidth are given by FIG. 5, and the values of the return loss are given by FIGS. 6A and 6B. FIGS. 5 to 6B will be described later.

TABLE 1

| Length L1 of Wide Portion | Fractional Bandwidth (%) | Return Loss (dB) |
| --- | --- | --- |
| 0λ (Without Wide Portion) | 3.91 | 0.96 |
| 0.1λ | 3.82 | 0.72 |
| 0.2λ | 3.74 | 0.74 |
| 0.3λ | 3.64 | 0.75 |
| 0.4λ | 3.56 | 0.80 |
| 0.5λ | 3.50 | 0.89 |
| 0.6λ | 3.47 | 0.93 |
| 0.7λ | 3.46 | 0.92 |

Conditions in Example 1 were as follows: the wavelength λ of the acoustic wave as determined by the electrode-to-electrode pitch of the IDT electrode of the first series-arm resonator 110s was about 2.1 μm; the intersecting width L was about 12λ; the number of electrode finger pairs was 200; and the electrode duty ratio was about 0.5. Referring to Table 1, 0λ provided as the length L1 of the wide portion wp indicates that none of the electrode fingers included the wide portion wp and that the width of the electrode-finger central portion cp of each electrode finger was equal or substantially equal to the width of the second end e2 of each electrode finger. Dividing the difference between the anti-resonant frequency and the resonant frequency by the resonant frequency and by multiplying the quotient by 100 gives the fractional bandwidth.

Figure 4:
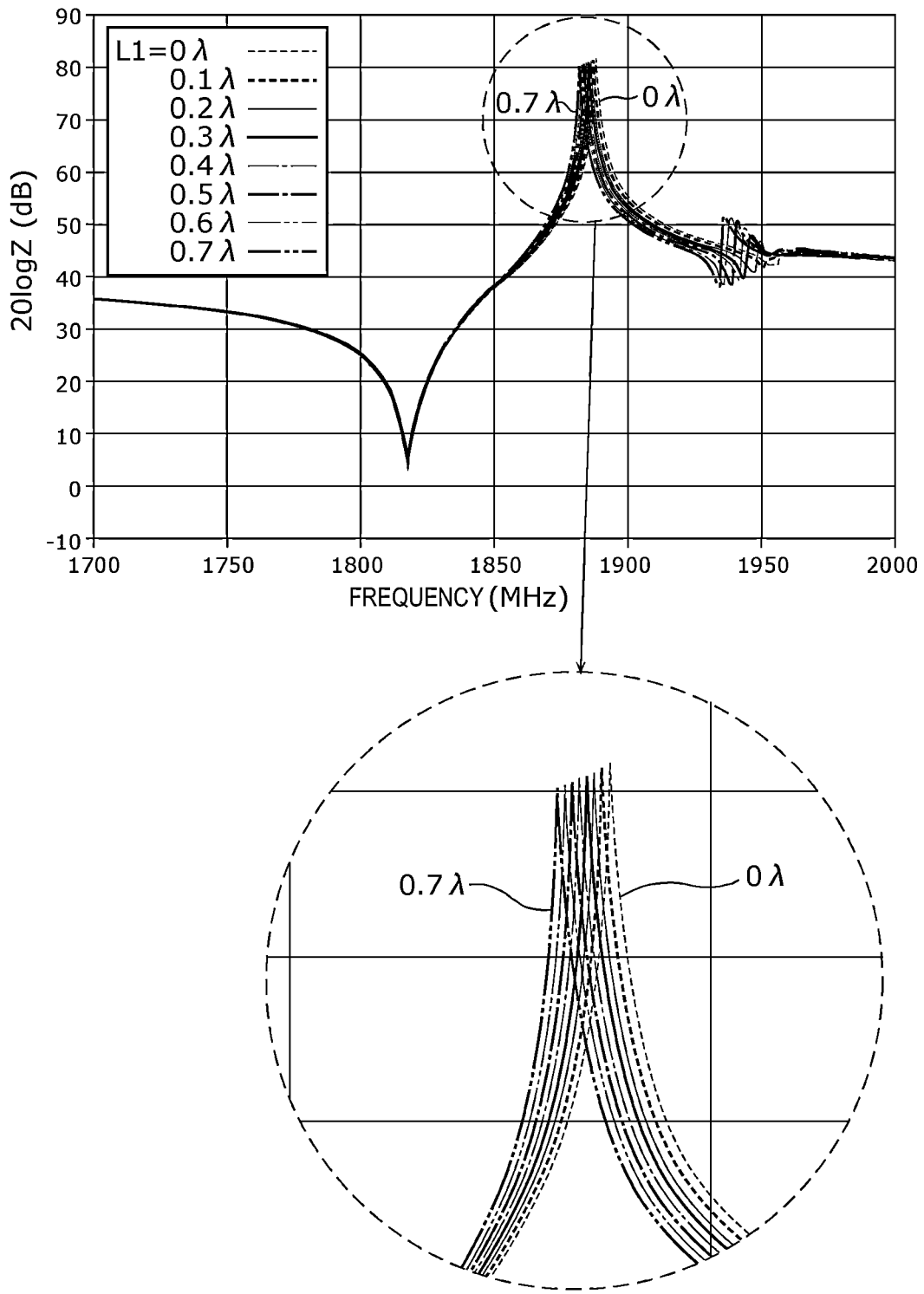
FIG. 4 is a graphical representation of the impedance characteristics of the first series-arm resonator according to Example 1 of Preferred Embodiment 1 of the present invention.

FIG. 4 is a graphical representation of the impedance characteristics of the first series-arm resonator 110s according to Example 1. FIG. 4 illustrates the impedance characteristics of the series-arm resonator 110s with variations in the length L1 of the wide portion wp within a range of 0 to about 0.7λ.

FIG. 4 indicates that as the length L1 of the wide portion wp of each electrode finger in the first series-arm resonator 110s increased gradually within a range of 0 to about 0.7λ, the anti-resonant frequency of the first series-arm resonator 110s was shifted toward the lower frequency side.

FIG. 5 is a graphical representation of the fractional bandwidth of the first series-arm resonator 110s according to Example 1. FIG. 5 illustrates the fractional bandwidth of the series-arm resonator 110s with variations in the length L1 of the wide portion wp within a range of 0 to about 0.7λ.

FIG. 5 indicates that when the length L1 of the wide portion wp was within a range of about 0.1 to about 0.4λ, the fractional bandwidth decreased constantly as the length L1 of the wide portion wp increased. FIG. 5 also indicates that when the length L1 of the wide portion wp was not less than about 0.5λ, the fractional bandwidth decreased gradually at a rate lower than the rate of change in fractional bandwidth with the length L1 within a range of 0.1 to about 0.4λ.

As can be seen from FIGS. 4 and 5, increasing the length L1 of the wide portion wp provides a reduction in the fractional bandwidth and causes a shift of the anti-resonant frequency toward the low frequency side. The attenuation slope in a frequency range higher than the pass band of the acoustic wave filter 10 becomes steeper accordingly. When the length L1 of the wide portion wp is unduly large, spurious waves can be generated in the pass band of the acoustic wave filter as will be described below.

FIG. 6A is a graphical representation of the return loss of the first series-arm resonator according to Example 1, where each electrode finger in the first series-arm resonator included a wide portion having a length of 0λ, about 0.5λ, about 0.6λ, or about 0.7λ. FIG. 6B is a graphical representation of the return loss of the first series-arm resonator according to Example 1, where each electrode finger in the first series-arm resonator included a wide portion having a length of about 0.1λ, about 0.2λ, about 0.3λ, or about 0.4λ. The pass band of the acoustic wave filter 10 including the first series-arm resonator 110s in FIGS. 6A and 6B was in a range of about 1,730 MHz to about 1,850 MHz.

FIG. 6A indicates that when the length L1 of the wide portion wp was 0λ (i.e., when none of the electrode fingers included the wide portion wp) or when the length L1 of the wide portion wp was not less than about 0.5λ, spurious waves were generated in the pass band of the acoustic wave filter 10, resulting in an increase in return loss. Meanwhile, FIG. 6B indicates that when the length L1 of the wide portion wp was not less than about 0.1λ and not more than about 0.4λ, spurious waves were reduced or prevented, and the return loss of the first series-arm resonator 110s was reduced accordingly. More specifically, when the length L1 of the wide portion wp was not less than about 0.1λ and not more than about 0.4λ, the return loss of the first series-arm resonator 110s was not more than about 0.8 dB, that is, did not exceed the level that would adversely affect the bandpass characteristics of the acoustic wave filter 10. This indicates that setting the length L1 of the wide portion wp to any value from about 0.1λ to about 0.4λ enables a reduction in the return loss in the pass band.

Referring to FIGS. 6A and 6B, the return loss observed at or around a frequency of about 1,940 MHz outside the pass band was an excitation mode in a waveguide on the wide portion wp and presumably had no direct impact on the pass band of the acoustic wave filter 10.

Figure 7:
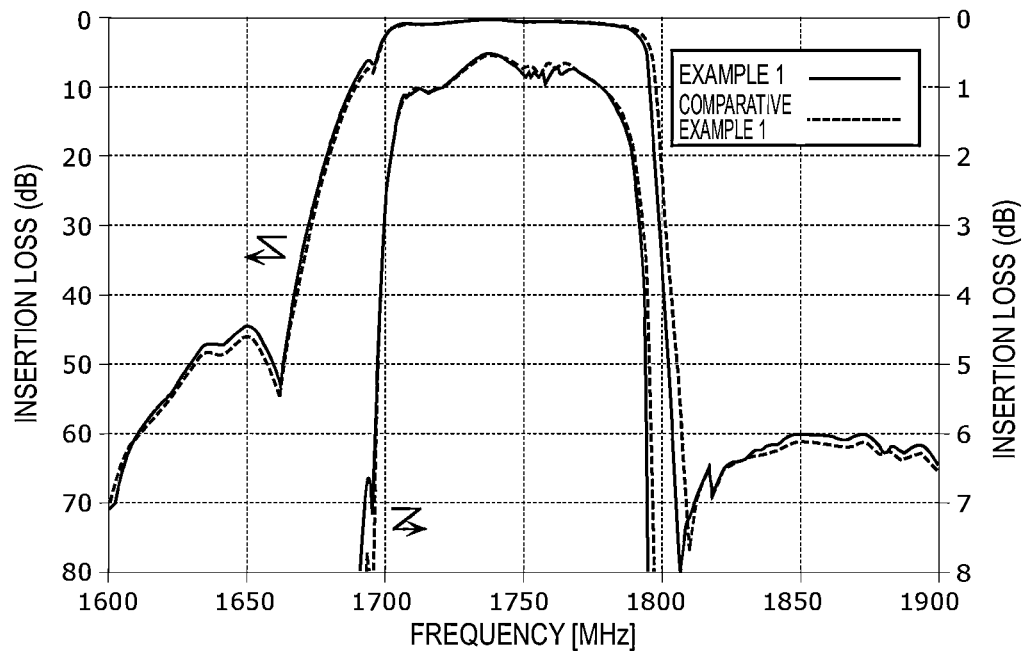
FIG. 7 is a graphical representation of the bandpass characteristics of the acoustic wave filter according to Example 1 of Preferred Embodiment 1 of the present invention.

The following describes the bandpass characteristics of the acoustic wave filter 10 according to Example 1 of Preferred Embodiment 1 with reference to FIG. 7.

FIG. 7 is a graphical representation of the bandpass characteristics of the acoustic wave filter 10 according to Example 1. FIG. 7 shows the insertion loss of the acoustic wave filter according to Example 1 and the insertion loss of an acoustic wave filter according to Comparative Example 1.

The acoustic wave filter 10 according to Example 1 differed from the acoustic wave filter according to Comparative Example 1 in that the length L1 of the wide portion wp of each electrode finger in the first series-arm resonator 110s was greater than the length L2 of the wide portion wp of each electrode finger in the second series-arm resonators 121s to 124s. More specifically, the length L1 of the wide portion wp of each electrode finger in the first series-arm resonator 110s was about 0.4λ, and the length L2 of the wide portion wp of each electrode finger in the second series-arm resonators 121s to 124s was about 0.2λ.

Further, electrode fingers in any of the series-arm resonators 110s and 121s to 124s of the acoustic wave filter according to Comparative Example 1 all included wide portions wp that were of the same length. More specifically, the wide portion wp of each electrode finger in the series-arm resonators 110s and 121s to 124s had a length of about 0.2λ.

Referring to FIG. 7, in a frequency range higher than the pass band, the attenuation slope of the acoustic wave filter 10 according to Example 1 is steeper than the attenuation slope of the acoustic wave filter according to Comparative Example 1. More specifically, the spacing (difference) between the frequency with an insertion loss of about 3 dB and the frequency with an insertion loss of about 55 dB in Comparative Example 1 was about 13.72 MHz, and the corresponding spacing (difference) in Example 1 was about 11.17 MHz. That is, a reduction of about 2.55 MHz was observed in Example 1. As to the acoustic wave filter 10 according to Example 1, no return loss causing potential problems was observed in the pass band of the acoustic wave filter, or more specifically, in a frequency range of about 1,710 MHz to about 1,785 MHz.

The above design, in which the length L1 of the wide portion wp of each electrode finger in the first series-arm resonator 110s is greater than the length L2 of the wide portion wp of each electrode finger in the second series-arm resonators 121s to 124s, enables a reduction in the return loss in the pass band while enabling the attenuation slope in a frequency range higher than the pass band to become steeper.

1-5 Example 2 According to Preferred Embodiment 1

Figure 8:
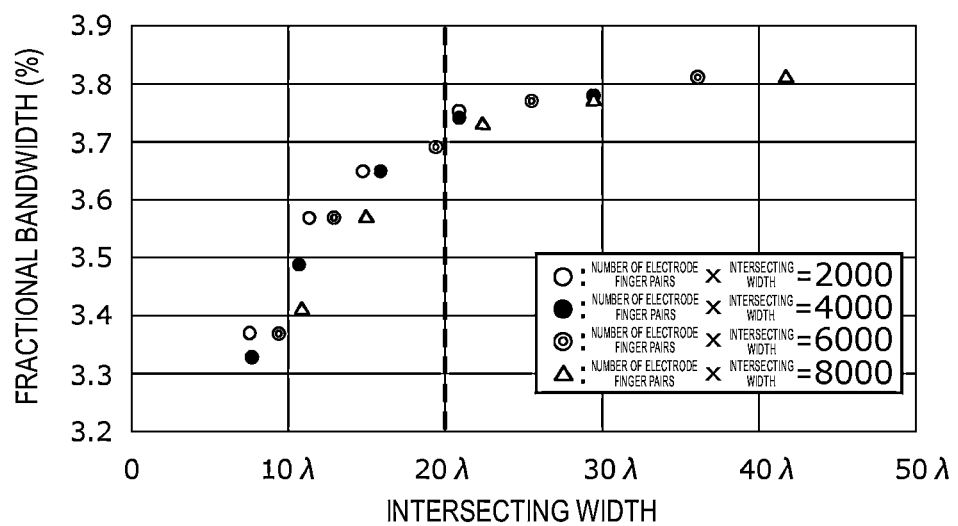
FIG. 8 is a graphical representation of the relationship between the fractional bandwidth and the intersecting width of the IDT electrode of the first series-arm resonator according to Example 2 of Preferred Embodiment 1 of the present invention.

The following describes characteristics of the first series-arm resonator 110s according to Example 2 of Preferred Embodiment 1 with reference to FIG. 8.

FIG. 8 is a graphical representation of the relationship between the fractional bandwidth and the intersecting width L of the IDT electrode of the first series-arm resonator 110s according to Example 2. FIG. 8 shows how the fractional bandwidth (%) changed when the intersecting width L was varied with the capacitance of the IDT electrode being fixed, that is, with the area determined by multiplying the intersecting width by the number of electrode finger pairs being fixed.

FIG. 8 indicates that when the intersecting width L was not less than about 7.5λ and not more than about 20λ, the fractional bandwidth (%) decreased as the intersecting width L was reduced. FIG. 8 also indicates that the fractional bandwidth did not change much when the intersecting width L was more than about 20λ. This indicates that setting the intersecting width L to about 20λ or less with no or substantially no change in the area of the IDT electrode enables a reduction in the fractional bandwidth. The attenuation slope in a frequency range outside the pass band of the acoustic wave filter 10 becomes steeper accordingly.

Figure 9:
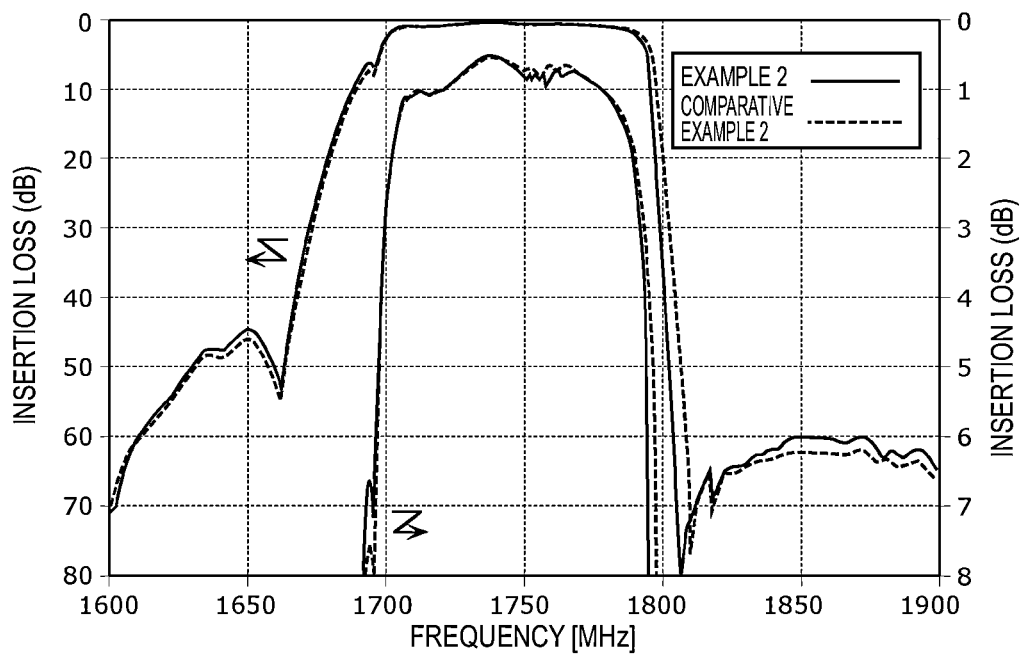
FIG. 9 is a graphical representation of the bandpass characteristics of the acoustic wave filter according to Example 2 of Preferred Embodiment 1 of the present invention.

The following describes the bandpass characteristics of the acoustic wave filter 10 according to Example 2 of Preferred Embodiment 1 with reference to FIG. 9.

FIG. 9 is a graphical representation of the bandpass characteristics of the acoustic wave filter 10 according to Example 2. FIG. 9 shows the insertion loss of the acoustic wave filter according to Example 2 and the insertion loss of an acoustic wave filter according to Comparative Example 2.

The acoustic wave filter 10 according to Example 2 differed from the acoustic wave filter according to Comparative Example 2 in that the length L1 of the wide portion wp of each electrode finger in the first series-arm resonator 110s was about 0.4λ, and the length L2 of the wide portion wp of each electrode finger in the second series-arm resonators 121s to 124s was about 0.2λ. The intersecting width L of the IDT electrode of the first series-arm resonator 110s was about 12λ, and the intersecting width L of each of the IDT electrodes of the second series-arm resonators 121s to 124s was also about 12λ.

Further, none of the electrode fingers in any of the series-arm resonators 110s and 121s to 124s of the acoustic wave filter according to Comparative Example 2 included the wide portion wp, and the electrode-finger central portions cp and the second ends e2 of the electrode fingers had the same or substantially the same width. The intersecting width L of each of the IDT electrodes of the series-arm resonators 110s and 121s to 124s was about 30λ.

Referring to FIG. 9, in a frequency range higher than the pass band, the attenuation slope of the acoustic wave filter 10 according to Example 2 is steeper than the attenuation slope of the acoustic wave filter according to Comparative Example 2. More specifically, the spacing (difference) between the frequency with an insertion loss of about 3 dB and the frequency with an insertion loss of about 55 dB in Comparative Example 2 was about 15.09 MHz, and the corresponding spacing (difference) in Example 2 was about 11.17 MHz. That is, a reduction of about 3.92 MHz was observed in Example 2. As to the acoustic wave filter 10 according to Example 2, no return loss causing potential problems was observed in the pass band of the acoustic wave filter, or more specifically, in a frequency range of about 1,710 MHz to about 1,785 MHz.

Example 2 had an advantage over Comparative Example 2. That is, the above design, in which the length L1 of the wide portion wp of each electrode finger in the first series-arm resonator 110s is greater than the length L2 of the wide portion wp of each electrode finger in the second series-arm resonators 121s to 124s and the intersecting width L of each IDT electrode is not more than about 20λ, prevents the return loss in the pass band from reaching a level causing potential problems while enabling the attenuation slope in a frequency range higher than the pass band to become steeper.

Preferred Embodiment 2

Figure 10:
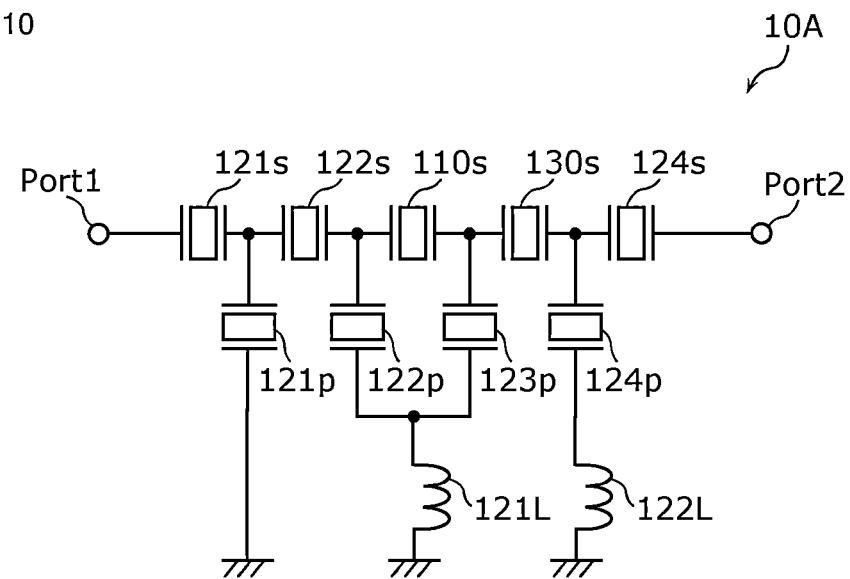
FIG. 10 is a circuit configuration diagram of an acoustic wave filter according to Preferred Embodiment 2 of the present invention.
Figure 11:
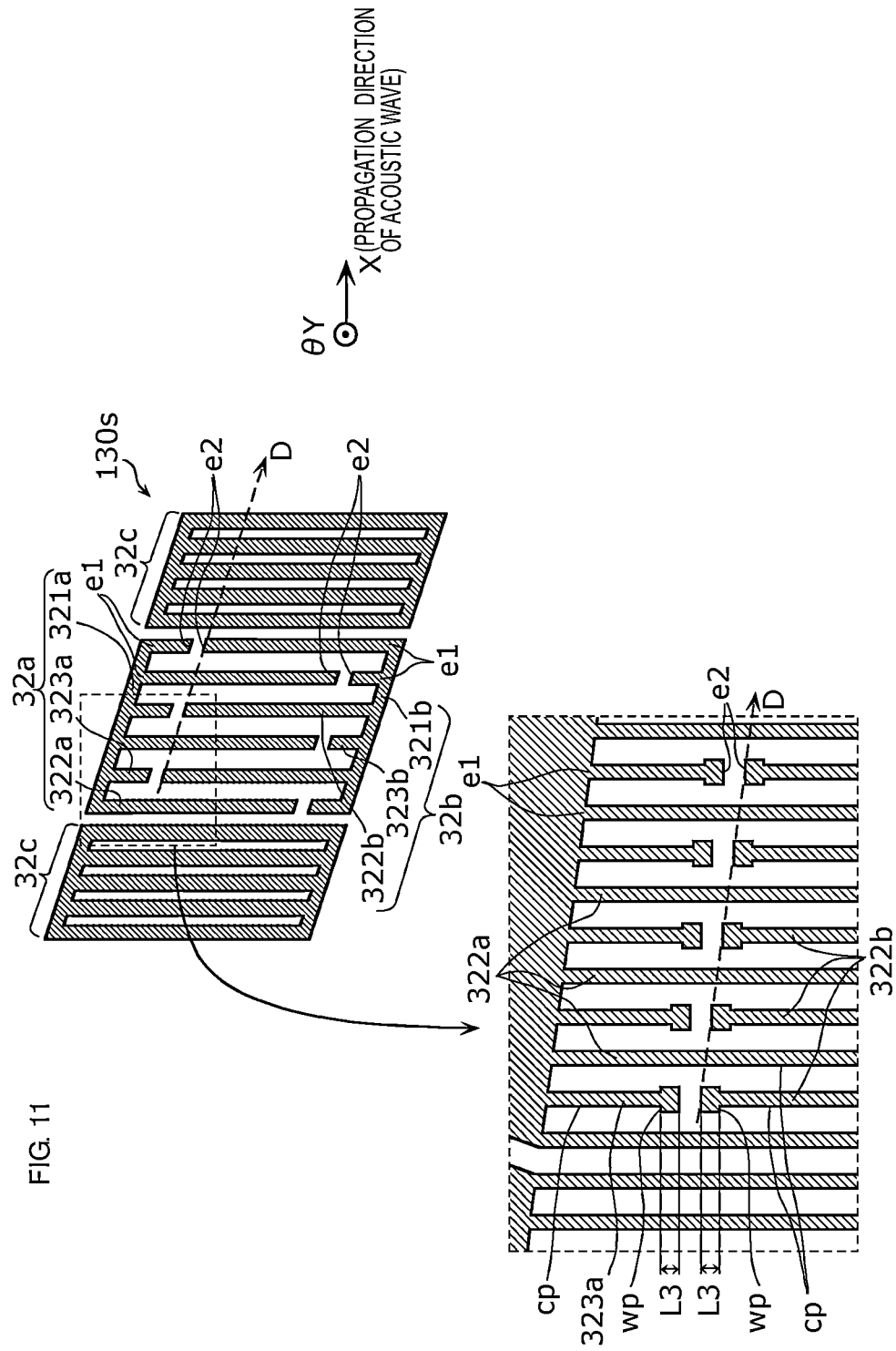
FIG. 11 illustrates an IDT electrode of a third series-arm resonator included in the acoustic wave filter according to Preferred Embodiment 2 of the present invention.

The following describes a basic configuration of an acoustic wave filter according to Preferred Embodiment 2 of the present invention with reference to FIGS. 10 and 11. The acoustic wave filter according to Preferred Embodiment 2 includes a third series-arm resonator 130s in place of the second series-arm resonator 123s in Preferred Embodiment 1.

FIG. 10 is a circuit configuration diagram of an acoustic wave filter 10A according to Preferred Embodiment 2.

The acoustic wave filter 10A includes series-arm resonators 121s, 122s, 110s, 130s, and 124s, parallel-arm resonators 121p to 124p, and inductors 121L and 122L. The series-arm resonators 121s, 122s, 110s, 130s, and 124s are disposed on a path connecting a first terminal Port1 and the second terminal Port2. The parallel-arm resonators 121p to 124p are disposed between the path and a reference terminal (i.e., ground).

The series-arm resonator 121s, 122s, 110s, 130s, and 124s are connected in series on the path (series arm) connecting the first terminal Port1 and the second terminal Port2. The second series-arm resonator 121s, the second series-arm resonator 122s, the first series-arm resonator 110s, the third series-arm resonator 130s, and the second series-arm resonator 124s are connected in series in the stated order in the direction from the first terminal Port1 to the second terminal Port2.

The parallel-arm resonators 121p to 124p are connected in parallel and disposed on respective paths (parallel arms) each of which connects the reference terminal and a corresponding one of points at which the series-arm resonators 121s, 122s, 110s, 130s, and 124s are connected to each other.

The series-arm resonators 121s, 122s, 110s, 130s, and 124s and the parallel-arm resonators 121p to 124p are connected as described above to define the acoustic wave filter 10A that is, for example, a ladder band-pass filter.

The resonant frequency of the first series-arm resonator 110s, the resonant frequencies of the second series-arm resonators 121s, 122s, and 124s, and the resonant frequency of the third series-arm resonator 130s are within the pass band of the acoustic wave filter 10A. The anti-resonant frequency of the first series-arm resonator 110s is lower than any of the anti-resonant frequencies of the second series-arm resonators 121s, 122s, and 124s. The anti-resonant frequency of the third series-arm resonator 130s is lower than any of the anti-resonant frequencies of the second series-arm resonators 121s, 122s, and 124s and is higher than the anti-resonant frequency of the first series-arm resonator 110s.

The third series-arm resonator 130s may be disposed between the second series-arm resonator 122s and the first series-arm resonator 110s. That is, the third series-arm resonator 130s is connected directly to the first series-arm resonator 110s.

FIG. 11 illustrates an IDT electrode of the third series-arm resonator 130s included in the acoustic wave filter 10A according to Preferred Embodiment 2.

The IDT electrode of the third series-arm resonator 130s is the same or substantially the same as the IDT electrode of the first series-arm resonator 110s. That is, L3 is greater than L2, where L3 denotes the length of the wide portion wp of each of the electrode fingers in the third series-arm resonator 130s, and L2 denotes the length of the wide portion wp of each of the electrodes of the second series-arm resonators 121s, 122s, and 124s. The length L3 is not more than the length L1 of the wide portion wp of each of the electrode fingers in the first series-arm resonator 110s (L2<L3 L1).

The acoustic wave filter 10A according to Preferred Embodiment 2 includes the third series-arm resonator 130s disposed on the path. The first series-arm resonator 110s and the third series-arm resonator 130s are connected in series. The third series-arm resonator 130s includes an IDT electrode including a pair of comb teeth-shaped electrodes (i.e., a comb teeth-shaped electrode 32a and a comb teeth-shaped electrode 32b) provided on a substrate including a piezoelectric layer. The comb teeth-shaped electrode 32a of the third series-arm resonator 130s includes electrode fingers 322a and a busbar electrode 321a, and the comb teeth-shaped electrode 32b of the third series-arm resonator 130s includes electrode fingers 322b and a busbar electrode 321b. The electrode fingers 322a and 322b extend in a direction orthogonal or substantially orthogonal to the propagation direction of the acoustic wave. The busbar electrode 321a connects first ends e1 of the electrode fingers 322a to each other, and the busbar electrode 321b connects first ends e1 of the electrode fingers 322b to each other.

The direction in which second ends e2 of the electrode fingers 322a are aligned with each other and second ends e2 of the electrode fingers 322b are aligned with each other is denoted by D and crosses the propagation direction of the acoustic wave. The electrode fingers of the IDT electrode of the third series-arm resonator 130s each include an electrode-finger central portion cp and a wide portion wp located at the second end e2 and being wider than the electrode-finger central portion cp. L3 is greater than L2, where L3 denotes the length of the wide portion wp of each of the electrode fingers 322a and 322b in the third series-arm resonator 130s in the direction in which the electrode fingers extend, and L2 denotes the length of the wide portion wp of each of the electrode fingers 322a and 322b in the second series-arm resonators 121s, 122s, and 124s in the direction in which the electrode fingers extend.

As in Preferred Embodiment 1, the acoustic wave filter 10A according to Preferred Embodiment 3 enables a reduction in the return loss in the pass band of the acoustic wave filter 10A while enabling the attenuation slope in a frequency range higher than the pass band to become steeper.

Preferred Embodiment 3

Preferred Embodiment 1 describes that the acoustic wave filter 10 includes only a ladder filter structure. In some preferred embodiments of the present invention, the filter includes a longitudinally coupled filter structure in addition to the ladder filter structure. A filter according to Preferred Embodiment 3 of the present invention includes these structures as will be described below.

Figure 12:
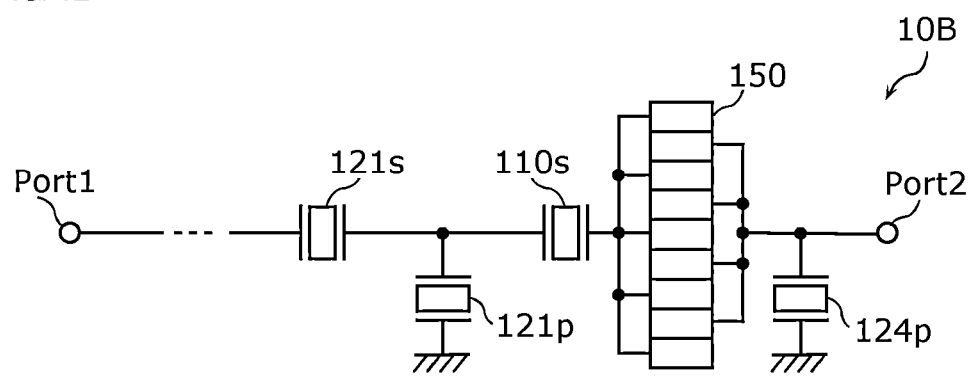
FIG. 12 is a circuit configuration diagram of an acoustic wave filter according to Preferred Embodiment 3 of the present invention.

FIG. 12 is a circuit configuration diagram of an acoustic wave filter 10B according to Preferred Embodiment 3.

As illustrated in FIG. 12, the acoustic wave filter 10B includes a second series-arm resonator 121s, a first series-arm resonator 110s, parallel-arm resonators 121p and 124p, and a longitudinally coupled resonator 150. That is, the acoustic wave filter 10B includes the longitudinally coupled resonator 150 in addition to the ladder filter structure.

The longitudinally coupled resonator 150 has a longitudinally coupled filter structure disposed between a first terminal Port1 and a second terminal Port2. The longitudinally coupled resonator 150 in the present preferred embodiment is preferably closer than the first series-arm resonator 110s to the second terminal Port2 and includes, for example, two reflectors and nine IDTs disposed between the reflectors. In some preferred embodiments of the present invention, the longitudinally coupled resonator 150 may be disposed between the second series-arm resonator 121s and the first series-arm resonator 110s. The longitudinally coupled resonator 150 does not necessarily include nine IDTs and may include three or more IDTs, for example.

As in the above preferred embodiments, the acoustic wave filter 10B enables a reduction in the return loss in the pass band of the acoustic wave filter 10B while enabling the attenuation slope in a frequency range higher than the pass band to become steeper.

As described above, the acoustic wave filter 10 according to Preferred Embodiment 1 includes the first series-arm resonator 110s and the second series-arm resonators 121s to 124s. The first series-arm resonator 110s and the second series-arm resonators 121s to 124s are disposed on the path connecting the first terminal Port1 and the second terminal Port2. The first series-arm resonator 110s has a lower anti-resonant frequency than the any other series-arm resonator included in the acoustic wave filter 10. The first series-arm resonator 110s and the second series-arm resonators 121s to 124s each include an IDT electrode including a pair of comb teeth-shaped electrodes (i.e., the comb teeth-shaped electrodes 32a and 32b) provided on the substrate 320 including the piezoelectric layer 327. Electrodes of the pair of comb teeth-shaped electrodes (i.e., the comb teeth-shaped electrodes 32a and 32b) of the first series-arm resonator 110s and electrodes of the pair of comb teeth-shaped electrodes (i.e., the comb teeth-shaped electrodes 32a and 32b) of each of the second series-arm resonator 121s to 124s each include the electrode fingers 322a, the electrode fingers 322b, and the busbar electrode 321a, and the busbar electrode 321b. The electrode fingers 322a and 322b extend in the direction orthogonal or substantially orthogonal to the propagation direction of the acoustic wave. The busbar electrode 321a connects the first ends e1 of the electrode fingers 322a to each other, and the busbar electrode 321b connects the first ends e1 of the electrode fingers 322b to each other. The direction D in which the second ends e2 of the electrode fingers 322a are aligned with each other and the second ends e2 of the electrode fingers 322b are aligned with each other crosses the propagation direction of the acoustic wave. The electrode fingers of the IDT electrode of the first series-arm resonator 110s and the electrode fingers of the IDT electrodes of the second series-arm resonators 121s to 124s each include the electrode-finger central portion cp and the wide portion wp located at the second end e2 and being wider than the electrode-finger central portion cp. L1 is greater than L2, where L1 denotes the length of the wide portion wp of each of the electrode fingers 322a and 322b in the first series-arm resonator 110s in the direction in which the electrode fingers extend, and L2 denotes the length of the wide portion wp of each of the electrode fingers 322a and 322b in the second series-arm resonators 121s to 124s in the direction in which the electrode fingers extend.

The above design, in which the electrode fingers 322a and 322b include the respective wide portions wp and the length L1 of the wide portion wp of each electrode finger in the first series-arm resonator 110s is greater than the length L2 of the wide portion wp of each electrode finger in the second series-arm resonators 121s to 124s, enables a reduction in the return loss in the pass band of the acoustic wave filter 10 while enabling the attenuation slope in a frequency range higher than the pass band to become steeper.

The length L1 of the wide portion wp of each electrode finger in the first series-arm resonator 110s may preferably be, for example, not less than about 0.1λ and not more than about 0.4λ, where λ denotes the wavelength of the acoustic wave filter 10.

The return loss in the pass band of the acoustic wave filter 10 may thus be prevented from reaching a level that causes potential problems.

The intersecting width L of the IDT electrode of the first series-arm resonator 110s may preferably be not more than about 20λ, for example.

The fractional bandwidth of the first series-arm resonator 110s may thus be reduced while the area determined by multiplying the intersecting width of the IDT electrode by the number of electrode finger pairs is fixed. This prevents the return loss in the pass band from reaching a level causing potential problems while enabling the attenuation slope in a frequency range higher than the pass band of the acoustic wave filter 10 to become steeper with the area being fixed.

The substrate 320 may include the piezoelectric layer 327, the high-acoustic-velocity support substrate 329, and the low-acoustic-velocity film 328 disposed between the high-acoustic-velocity support substrate 329 and the piezoelectric layer 327. The piezoelectric layer 327 includes two main surfaces, and the IDT electrode may be disposed on one of the two main surfaces of the piezoelectric layer 327. The acoustic velocity of the bulk wave propagating through the high-acoustic-velocity support substrate 329 is higher than the acoustic velocity of the acoustic wave propagating through the piezoelectric layer 327. The acoustic velocity of the bulk wave propagating through the low-acoustic-velocity film 328 is lower than the acoustic velocity of the acoustic wave propagating through the piezoelectric layer 327.

The Q-factor at the resonant frequency and the Q-factor at the anti-resonant frequency of a resonator having the structure mentioned above may be much higher than the corresponding Q-factors of a resonator having a known structure including a single piezoelectric substrate. That is, the multilayer structure may be used to obtain a SAW resonator with a high Q-factor, and the SAW resonator may be used to obtain an acoustic wave filter having a small insertion loss.

The acoustic wave filter 10A according to Preferred Embodiment 2 also includes the third series-arm resonator 130s disposed on the path. The first series-arm resonator 110s and the third series-arm resonator 130s are connected in series. The anti-resonant frequency of the third series-arm resonator 130s is lower than any of the anti-resonant frequencies of the second series-arm resonators 121s, 122s, and 124s. The third series-arm resonator 130s includes an IDT electrode including a pair of comb teeth-shaped electrodes (i.e., the comb teeth-shaped electrodes 32a and 32b) on the substrate 320 including the piezoelectric layer 327. The comb teeth-shaped electrode 32a of the third series-arm resonator 130s includes the electrode fingers 322a and the busbar electrode 321a, and the comb teeth-shaped electrode 32b of the third series-arm resonator 130s includes the electrode fingers 322b and the busbar electrode 321b. The electrode fingers 322a and 322b extend in the direction orthogonal or substantially orthogonal to the propagation direction of the acoustic wave. The busbar electrode 321a connects the first ends e1 of the electrode fingers 322a to each other, and the busbar electrode 321b connects the first ends e1 of the electrode fingers 322b to each other. The direction D in which the second ends e2 of the electrode fingers 322a are aligned with each other and the second ends e2 of the electrode fingers 322b are aligned with each other crosses the propagation direction of the acoustic wave. The electrode fingers of the IDT electrode of the third series-arm resonator 130s each include the electrode-finger central portion cp and the wide portion wp located at the second end e2 and being wider than the electrode-finger central portion cp. L3 is greater than L2, where L3 denotes the length of the wide portion wp of each of the electrode fingers 322a and 322b in the third series-arm resonator 130s in the direction in which the electrode fingers extend, and L2 denotes the length of the wide portion wp of each of the electrode fingers 322a and 322b in the second series-arm resonators 121s, 122s, and 124s in the direction in which the electrode fingers extend.

The above design, in which L3 is greater than L2 and the third series-arm resonator 130s is connected directly to the first series-arm resonator 110s, enables a reduction in the return loss in the pass band of the acoustic wave filter 10A while enabling the attenuation slope in a frequency range higher than the pass band to become much steeper.

The acoustic wave filters according to Preferred Embodiments 1, 2, and 3 of the present invention have been described above. Although the present invention has been described with reference to preferred embodiments, the present invention also includes other preferred embodiments provided by varying combinations of components of the aforementioned preferred embodiments, other modifications achieved through various alterations to the preferred embodiments that may be conceived by those skilled in the art within a range not departing from the spirit of the present invention, and various types of apparatuses including the acoustic wave filters according to preferred embodiments of the present invention.

The preferred embodiments described above each include the series-arm resonators including offset electrode fingers. In some preferred embodiments, however, none of the series-arm resonators includes the offset electrode fingers.

In the preferred embodiments described above, the length L1 of the wide portion wp of each electrode finger in the first series-arm resonator 110s is greater than the length L2 of the wide portion wp of each electrode finger in the second series-arm resonators 121s to 124s. In some preferred embodiments, however, the length L1 of the wide portions wp of, for example, about 50% or more of the electrode fingers in the first series-arm resonator 110s is greater than the length L2.

The acoustic wave filter 10 may be used as a transmitting filter or a receiving filter. The acoustic wave filter 10 may be used as a transmitting filter in the following manner: a transmission wave generated by a transmitting circuit, such as a radio-frequency integrated circuit (RFIC), for example, and input to the acoustic wave filter 10 through the second terminal Port2 is filtered in a predetermined transmission pass band, and the resultant wave is output to the first terminal Port1. The acoustic wave filter 10 may be used as a receiving filter in the following manner: a reception wave input to the acoustic wave filter 10 through the first terminal Port1 is filtered in a predetermined reception pass band, and the resultant wave is output to the second terminal Port2.

The first terminal Port1 may be an input terminal or an output terminal. Similarly, the second terminal Port2 may be an input terminal or an output terminal. When the first terminal Port1 is an input terminal, the second terminal Port2 may be an output terminal. When the second terminal Port2 is an input terminal, the first terminal Port1 may be an output terminal.

Preferred embodiments of the present invention may be included, for example, in multiplexers including acoustic wave filters, front-end circuits, and communication devices and thus have wide applicability to communication apparatuses, such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
a first series-arm resonator and a second series-arm resonator on a path connecting a first terminal and a second terminal; wherein
the first series-arm resonator has a lower anti-resonant frequency than any other series-arm resonator included in the acoustic wave filter;
the first series-arm resonator and the second series-arm resonator each include an interdigital transducer (IDT) electrode including a pair of comb teeth-shaped electrodes on a substrate including a piezoelectric layer;
electrodes of the pair of comb teeth-shaped electrodes of the first series-arm resonator and electrodes of the pair of comb teeth-shaped electrodes of the second series-arm resonator each include electrode fingers and a busbar electrode, the electrode fingers extending in a direction orthogonal or substantially orthogonal to a propagation direction of an acoustic wave, the busbar electrode connecting first ends of the electrode fingers to each other;
a direction in which second ends of the electrode fingers are aligned with each other crosses the propagation direction of the acoustic wave;
the electrode fingers of the IDT electrode of the first series-arm resonator and the electrode fingers of the IDT electrode of the second series-arm resonator each include an electrode-finger central portion and a wide portion located at the second end and being wider than the electrode-finger central portion; and
a length of the wide portion of each of the electrode fingers in the first series-arm resonator in the direction in which the electrode fingers extend is greater than a length of the wide portion of each of the electrode fingers in the second series-arm resonator in the direction in which the electrode fingers extend.

2. The acoustic wave filter according to claim 1, wherein the length of the wide portion of each of the electrode fingers in the first series-arm resonator is not less than about 0.1λ and not more than about 0.4λ, where λ denotes a wavelength of the acoustic wave.

3. The acoustic wave filter according to claim 1, wherein an intersecting width of the IDT electrode of the first series-arm resonator is not more than about 20λ, where λ denotes a wavelength of the acoustic wave.

4. The acoustic wave filter according to claim 1, wherein the substrate includes:
a piezoelectric layer including two main surfaces, the IDT electrode of each of the first series-arm resonator and the second series-arm resonator being disposed on one of the two main surfaces;
a high-acoustic-velocity support substrate, an acoustic velocity of a bulk wave propagating through the high-acoustic-velocity support substrate being higher than an acoustic wave velocity of an acoustic wave propagating through the piezoelectric layer; and
a low-acoustic-velocity film disposed between the high-acoustic-velocity support substrate and the piezoelectric layer, an acoustic velocity of a bulk wave propagating through the low-acoustic-velocity film being lower than an acoustic velocity of an acoustic wave propagating through the piezoelectric layer.

5. The acoustic wave filter according to claim 4, wherein the high-acoustic-velocity support substrate is a silicon substrate having a thickness of about 125 μm.

6. The acoustic wave filter according to claim 4, wherein the low-acoustic-velocity film includes silicon dioxide as a main component and has a thickness of about 670 nm.

7. The acoustic wave filter according to claim 1, further comprising a parallel-arm resonator disposed on a path connecting a reference terminal and a node at which the first series-arm resonator and the second series-arm resonator are connected.

8. The acoustic wave filter according to claim 7, further comprising a plurality of the parallel-arm resonators.

9. The acoustic wave filter according to claim 7, wherein the first series-arm resonator, the second series-arm resonator, and the parallel-arm resonator define a ladder band-pass filter.

10. The acoustic wave filter according to claim 1, wherein each of the first and second series-arm resonators is a surface acoustic wave resonator.

11. The acoustic wave filter according to claim 1, wherein each of the first and second series-arm resonators includes a reflector disposed on both sides of the respective first or second series-arm resonator in the propagation direction.

12. The acoustic wave filter according to claim 1, wherein each of the IDT electrodes of the first and second series-arm resonators includes an adhesive layer on the piezoelectric layer and a main electrode layer on the adhesive layer.

13. The acoustic wave filter according to claim 12, wherein the adhesive layer includes Ti as a main component.

14. The acoustic wave filter according to claim 12, wherein the main electrode layer includes Al as a main component and a Cu content of about 1%.

15. The acoustic wave filter according to claim 1, wherein each of the IDT electrodes of the first and second series-arm resonators is covered with a protective layer.

16. The acoustic wave filter according to claim 15, wherein the protective layer includes silicon dioxide as a main component.

17. The acoustic wave filter according to claim 1, wherein the piezoelectric layer is made of a θ°-rotated Y cut X SAW propagation LiTaO$_3$ piezoelectric single crystal.

18. The acoustic wave filter according to claim 1, wherein the piezoelectric layer has a thickness of about 600 nm.

19. The acoustic wave filter according to claim 1, further comprising:
a third series-arm resonator disposed on the path, the first series-arm resonator and the third series-arm resonator being connected in series; wherein
the third series-arm resonator has a lower anti-resonant frequency than the second series-arm resonator;
the third series-arm resonator includes an IDT electrode including a pair of comb teeth-shaped electrodes provided on a substrate including a piezoelectric layer;

electrodes of the pair of comb teeth-shaped electrodes of the third series-arm resonator each include electrode fingers and a busbar electrode, the electrode fingers extending in the direction orthogonal or substantially orthogonal to the propagation direction of the acoustic wave, the busbar electrode connecting first ends of the electrode fingers to each other;

a direction in which second ends of the electrode fingers are aligned with each other crosses the propagation direction of the acoustic wave;

the electrode fingers of the IDT electrode of the third series-arm resonator each include an electrode-finger central portion and a wide portion located at the second end and being wider than the electrode-finger central portion; and a length of the wide portion of each of the electrode fingers in the third series-arm resonator in the direction in which the electrode fingers extend is greater than the length of the wide portion of each of the electrode fingers in the second series-arm resonator in the direction in which the electrode fingers extend.

20. The acoustic wave filter according to claim 1, further comprising a plurality of the second series-arm resonators.

* * * * *